United States Patent
Zhang et al.

(10) Patent No.: US 10,101,838 B2
(45) Date of Patent: Oct. 16, 2018

(54) IN-CELL TOUCH DISPLAY PANEL AND ELECTRONIC DEVICE

(71) Applicant: Wuhan China Star Optoelectronics Technology Co., Ltd., Wuhan (CN)

(72) Inventors: Hongsen Zhang, Wuhan (CN); Yaoli Huang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 14 days.

(21) Appl. No.: 15/514,527

(22) PCT Filed: Feb. 17, 2017

(86) PCT No.: PCT/CN2017/073884
§ 371 (c)(1),
(2) Date: Mar. 26, 2017

(87) PCT Pub. No.: WO2018/126516
PCT Pub. Date: Jul. 12, 2018

(65) Prior Publication Data
US 2018/0232086 A1 Aug. 16, 2018

(30) Foreign Application Priority Data
Jan. 6, 2017 (CN) .......................... 2017 1 0010363

(51) Int. Cl.
*G06F 3/041* (2006.01)
*H01L 27/12* (2006.01)

(52) U.S. Cl.
CPC .......... *G06F 3/0412* (2013.01); *H01L 27/124* (2013.01); *G09G 2310/0264* (2013.01)

(58) Field of Classification Search
CPC ......... G06F 3/044; G06F 3/041; G06F 3/0412
See application file for complete search history.

(56) References Cited

U.S. PATENT DOCUMENTS

2004/0263755 A1* 12/2004 Kim .................. G02F 1/133512
349/141
2013/0271715 A1* 10/2013 Kawashima ...... G02F 1/134336
349/143
(Continued)

*Primary Examiner* — Olga Merkoulova
(74) *Attorney, Agent, or Firm* — Leong C. Lei

(57) ABSTRACT

The invention provides a touch display panel and an electronic device, with the positions of pixel electrode layer and common electrode layer at the side of array substrate in conventional touch display panel changed; wherein common electrode layer (21) as touch sensor is changed to the top, and pixel electrode layer (16) is changed to below common electrode layer (21). Pixel electrode (16) is connected to source/drain (145) of TFT (14) via first through hole (V1) penetrating planarization layer (15), which requiring only to drill planarization layer without the need to drill both the protective layer and planarization layer as in prior art to achieve connecting pixel electrode to TFT. The invention saves a mask, a drilling process and production cost and improves production efficiency. Moreover, placing common electrode (21) as touch sensor at the top facilitates optimizing sensitivity and SNR, thereby improves touch performance and product quality.

13 Claims, 4 Drawing Sheets

(56) References Cited

U.S. PATENT DOCUMENTS

2016/0026291 A1* 1/2016 Zhao .................. G06F 3/044
                                                    345/174
2016/0291749 A1* 10/2016 Zhou ................. G06F 3/0412
2018/0173348 A1* 6/2018 Huang ................ G02F 1/1333

* cited by examiner

IN-CELL TOUCH DISPLAY PANEL AND ELECTRONIC DEVICE

BACKGROUND OF THE INVENTION

1. Field of the Invention

The present invention relates to the field of touch display techniques, and in particular to an in-cell touch display panel and electronic device.

2. The Related Arts

The touch technology, as an important indicator of smart technology, is applied more and more widely. Through rapid development, the touch technology, in accordance with the principle of touch, can be divided into piezo-resistive, optical, capacitive, and so on, wherein the capacitive touch technology is the most widely used after gone through several generations of development. The capacitive touch technology can be divided into add-on type, on-cell type and in-cell type.

At present, the in-cell touch display panels are increasingly used in mobile phones and other electronic display devices. The in-cell touch display panel integrates the touch function and the display function together by manufacturing the touch sensor between the thin film transistor (TFT) array substrate and color filter (CF) substrate to make the touch display thinner and light as well as better optical display performance while ensuring touch sensitivity. Meanwhile, the integration of display and touch driver circuits into a single chip and reduce cost for mass production.

The traditional in-cell touch display panel is mainly based on a design by adding a touch sensor layer to the TFT array substrate. In general, the bottom indium tin oxide (BITO) electrode at the side of the TFT array substrate used as the common electrode is divided into a plurality of patternized touch sensing electrodes, usually of square or rectangular shape. Then, a metal layer is added as a touch signal line between the BITO and the top indium tin oxide (TITO) electrode used as pixel electrode. Each touch sensing electrode is connected to a corresponding touch signal line via passing a through hole, and finally connected to the integrated chip of display and touch driving. This structure is referred to as IMI architecture.

Specifically, refer to FIG. 1. The TFT array substrate of the conventional in-cell touch display panel comprises, stacked from top to bottom, a base substrate 10, a light-shielding layer 20, a buffer layer 30, an active layer 40, a gate insulating layer 50, a gate 60, an interlayer insulating layer 70, a source/drain 80, a planarization layer 90, a common electrode layer 100, a top insulating layer 110, a touch signal line 120, a protective layer 130, and a pixel electrode layer 140. As described above, the common electrode layer 100 at the bottom is cut into a plurality of square or rectangular touch sensing electrodes 1001, and the different touch sensing electrodes 1001 are completely spaced apart. The touch signal line 120 contacts the touch sensing electrode 1001 through the first through hole V10 which penetrates the top layer insulating layer 110; the pixel electrode layer 140 passes through the second through hole V20 of the protective layer 130 and the third through hole V30, which contacting the second through hole V20 and penetrates the top layer insulating layer 110 and the planarization layer 90 to contact the source/drain 80. This IMI architecture requires two masks and two drilling processes (including exposure with mask, etching and peeling off).

Refer to FIG. 2. The block represents a touch sensing electrode 1001. Each touch sensing electrode 1001 is connected to the integrated chip 200 of display and touch driving via a corresponding touch signal line 120. The operating principle of the inc-ell touch display panel is that the capacitive amount sensed by the touch sensing electrode 1001 is different before and after the finger touches panel, and the integrated chip 200 of display and touch driving detects the finger touching position by detecting the capacitance change amount.

Although the touch display panel based on the conventional IMI architecture can realize the touch function, the manufacturing process requires more masks and more technical processes and results a higher production cost.

SUMMARY OF THE INVENTION

The object of the present invention is to provide an in-cell touch display panel, produced by a process using less masks and processes than the prior art, able to reduce the production cost, improve the production efficiency and improve the touch performance and improve the product quality.

Another object of the present invention is to provide an electronic device, with an in-cell touch display panel, produced by a process using less masks and processes than the prior art, able to reduce the production cost, improve the production efficiency and improve the touch performance and improve the product quality.

To achieve the above object, the present invention provides an in-cell touch display panel, which comprises: a thin film transistor (TFT) array substrate, the TFT arrays substrate comprising a plurality of TFTs arranged in an array, a planarization layer on top of the TFTs, a pixel electrode layer disposed on top of the planarization layer, a protective layer disposed on top of the pixel electrode layer, a metal layer disposed on top of the protective layer, a top insulating layer disposed on top of the metal layer, and a common electrode layer used as a touch sensor disposed on top of the top insulating layer;

the pixel electrode layer comprising a plurality of independent pixel electrodes arranged in an array; the metal layer comprising a plurality of touch signal lines; the common electrode layer comprising a plurality of touch sensing areas, with each touch sensing area disposed with a plurality of touch sensing electrode patterns, and the touch sensing electrode patterns of a same row connected serially, and the touch sensing electrode patterns of a same column connected together through a corresponding touch signal line;

the pixel electrode connected to the TFT via a first through hole penetrating the planarization layer; the touch sensing electrode pattern connected to the corresponding touch signal line via a second through hole penetrating the top insulating layer.

According to a preferred embodiment of the present invention, the pixel electrode has a block shape.

According to a preferred embodiment of the present invention, the pixel electrode layer and the common electrode layer are made of indium tin oxide (ITO).

According to a preferred embodiment of the present invention, the in-cell touch display panel further comprises a color filter (CF) substrate disposed opposite to the TFT array substrate, and a liquid crystal (LC) layer disposed between the TFT array substrate and the CF substrate.

According to a preferred embodiment of the present invention, the TFT substrate further comprises: a glass base, a light-shielding layer disposed on the glass base, a buffer layer disposed on the glass base and the light-shielding layer; with the TFTs disposed on top of the buffer layer;

the TFT comprising: an active layer disposed on top of the buffer layer, a gate insulating layer disposed on top of the active layer and the buffer layer, a gate disposed on top of the gate insulating layer at a location above the active layer, an interlayer insulating layer disposed on top of the gate and the gate insulating layer, and a source/drain disposed on the interlayer insulating layer contacting two sides of the active layer;

the pixel electrode connected to the source/drain of the TFT via the first through hole penetrating the planarization layer.

Another embodiment of the present invention provides an electronic device, which comprises the aforementioned in-cell touch display panel.

Yet another embodiment of the present invention provides an in-cell touch display panel, which comprises: a thin film transistor (TFT) array substrate, the TFT arrays substrate comprising a plurality of TFTs arranged in an array, a planarization layer on top of the TFTs, a pixel electrode layer disposed on top of the planarization layer, a protective layer disposed on top of the pixel electrode layer, a metal layer disposed on top of the protective layer, a top insulating layer disposed on top of the metal layer, and a common electrode layer used as a touch sensor disposed on top of the top insulating layer;

the pixel electrode layer comprising a plurality of independent pixel electrodes arranged in an array; the metal layer comprising a plurality of touch signal lines; the common electrode layer comprising a plurality of touch sensing areas, with each touch sensing area disposed with a plurality of touch sensing electrode patterns, and the touch sensing electrode patterns of a same row connected serially, and the touch sensing electrode patterns of a same column connected together through a corresponding touch signal line;

the pixel electrode connected to the TFT via a first through hole penetrating the planarization layer; the touch sensing electrode pattern connected to the corresponding touch signal line via a second through hole penetrating the top insulating layer;

wherein the pixel electrode having a block shape.

wherein the pixel electrode layer and the common electrode layer being made of indium tin oxide (ITO).

The present invention provides the following advantages. The present invention provides an in-cell touch display panel and an electronic device. The positions of the pixel electrode layer and the common electrode layer at the side of array substrate in the conventional touch display panel are changed; wherein the common electrode layer used as the touch sensor is changed to the top layer, and the pixel10 electrode layer is changed to below the common electrode layer. The pixel electrode is connected to the source/drain of the TFT via the first through hole penetrating the planarization layer, which requiring only to drill the planarization layer without the need to drill both the protective layer and the planarization layer as in the prior art to achieve the connection of the pixel electrode to the TFT. As such, the process eliminates a mask and a drilling process and saves production cost and improves production efficiency. In addition, placing the common electrode as the touch sensor at the top layer also facilitates optimizing the sensitivity and signal-to-noise ratio (SNR), thereby improves the touch performance and product quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
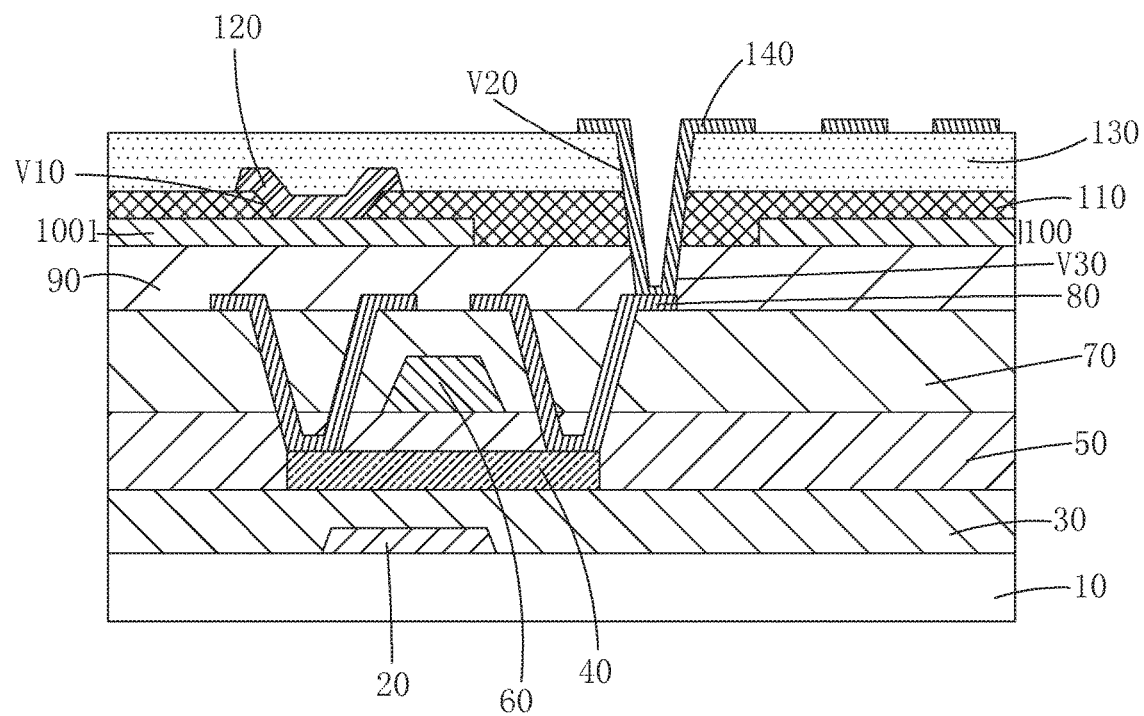
FIG. 1 is a cross-sectional view showing the TFT array substrate of a conventional in-cell touch display panel.
Figure 2:
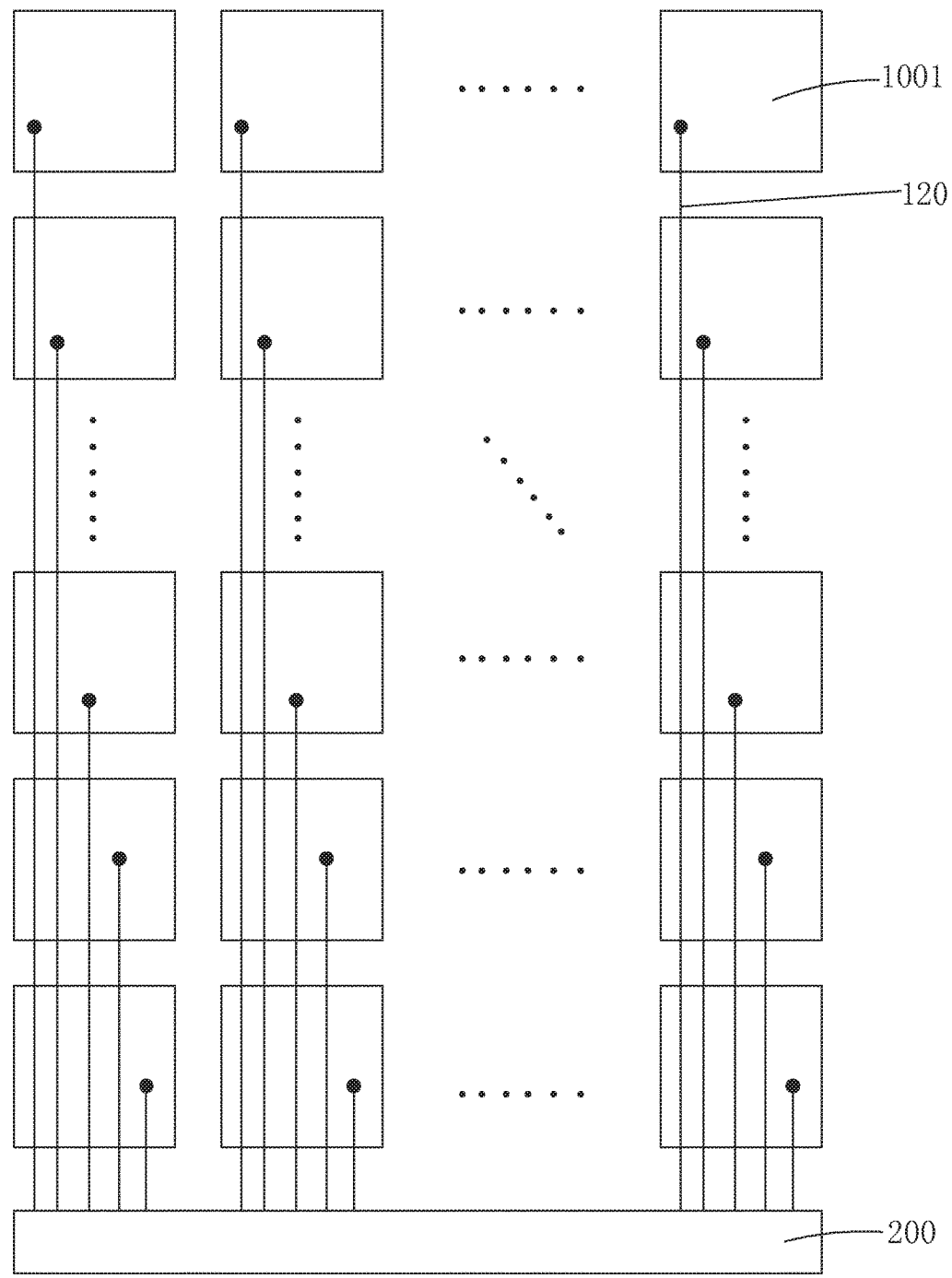
FIG. 2 is a schematic view showing the distribution of the touch sensing electrodes and the touch signal lines in a conventional in-cell touch display panel.
Figure 3:
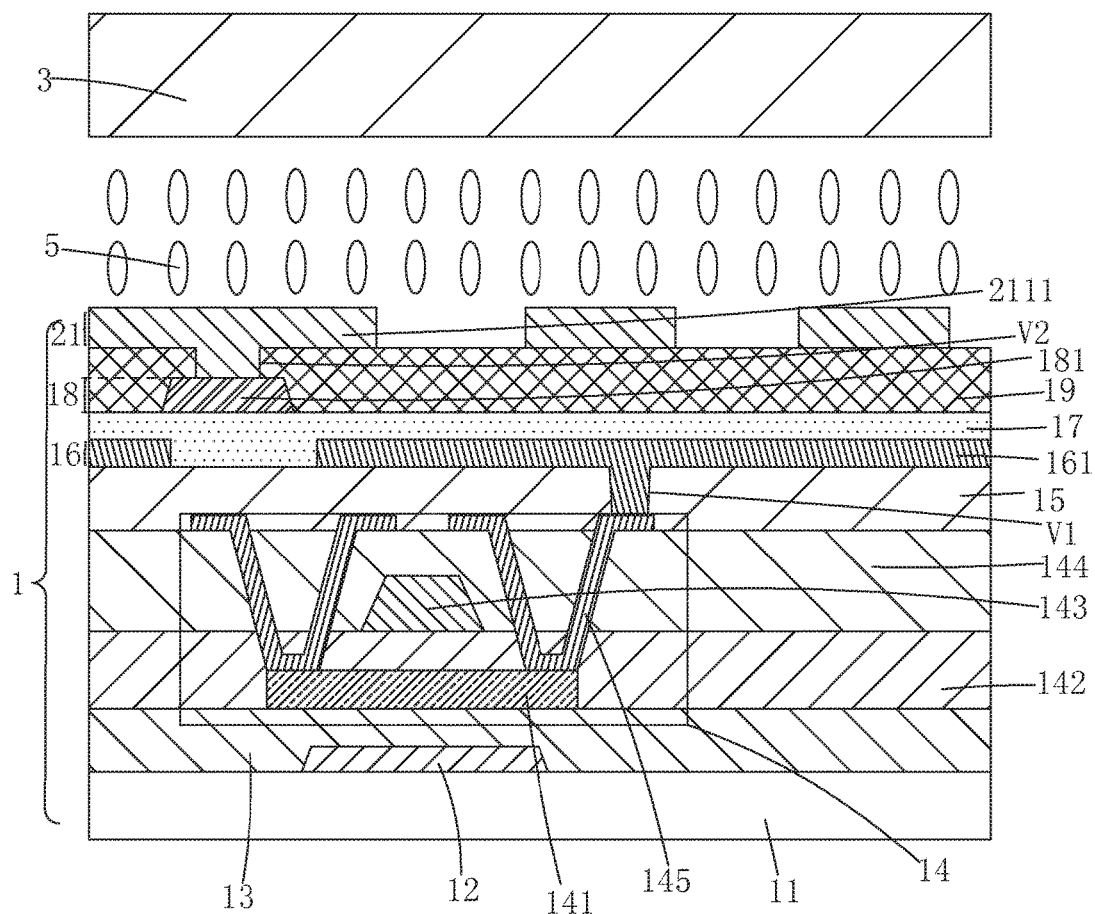
FIG. 3 is a cross-sectional view showing the in-cell touch display panel provided by an embodiment of the present invention.
Figure 4:
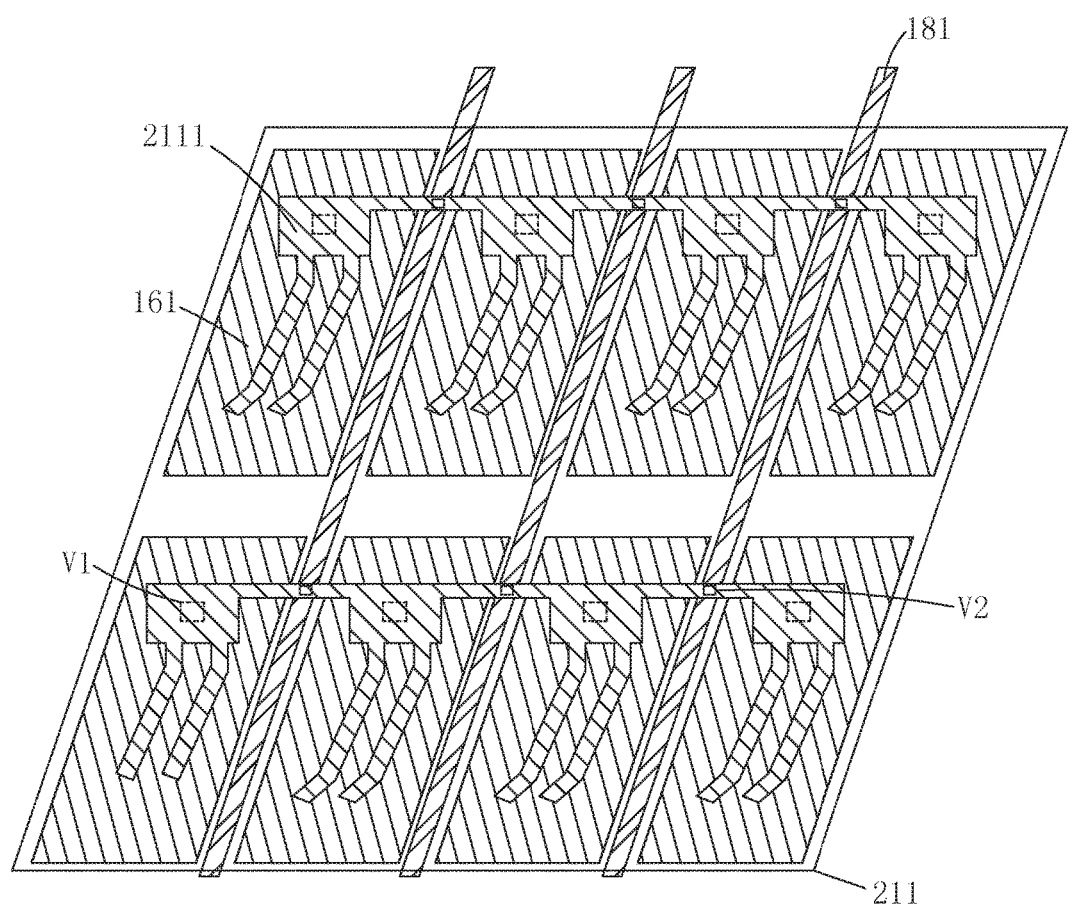
FIG. 4 is a planar view showing the distribution of the pixel electrodes, touch sensing electrode patterns and touch signal lines in a touch sensing area of the in-cell display panel provided by an embodiment of the present invention.

Referring to FIG. 3 and FIG. 4. The present invention provides an in-cell touch display panel, which comprises: a thin film transistor (TFT) array substrate 1, a color filter (CF) substrate 3 disposed opposite to the TFT array substrate 1, and a liquid crystal (LC) layer 5 sandwiched between the TFT array substrate 1 and the CF substrate 3.

The TFT array substrate 1 comprises: a glass base 11, a light-shielding layer 12 disposed on the glass base 11, a buffer layer 13 disposed on the glass base 11 and the light-shielding layer 12; a plurality of TFTs 14 arranged in an array and disposed on top of the buffer layer 13, a planarization layer 15 on top of the TFTs 14, a pixel electrode layer 16 disposed on top of the planarization layer 15, a protective layer 17 disposed on top of the pixel electrode layer 16, a metal layer 18 disposed on top of the protective layer 17, a top insulating layer 19 disposed on top of the metal layer 18, and a common electrode layer 21 used as a touch sensor disposed on top of the top insulating layer 19.

Specifically, the CF substrate 3 usually comprises a base layer, a color film layer having red, green and blue color-resist, and a black matrix (BM) layer; and further comprises, which is the known technology, and the details is not described here.

The TFTs 14 can be of top-gate structure, or bottom-gate structure. Take the top-gate structure as example, each TFT 14 comprises: an active layer 141 disposed on top of the buffer layer 13, a gate insulating layer 142 disposed on top of the active layer 141 and the buffer layer 13, a gate 143 disposed on top of the gate insulating layer 142 at a location above the active layer 141, an interlayer insulating layer 144 disposed on top of the gate 143 and the gate insulating layer 142, and a source/drain 145 disposed on the interlayer insulating layer 144 contacting two sides of the active layer 141; and the light-shielding layer 12 is disposed correspondingly below the active layer 141.

Moreover, the pixel electrode layer 16 and the common electrode layer 21 are made of indium tin oxide (ITO). The metal layer 18 can be made of materials with good conductivity, such as, Cu, Ag, Al, and so on. The buffer layer 13, the gate insulating layer 142, the interlayer insulating layer 144 and the top insulating layer 19 can be made of inorganic materials, such as, SiOx, SiNx, and so on. The active layer 141 comprises a groove area, a lightly-doped drain area, and a heavily-doped area. The light-shielding area 12 must shield the groove area of the active layer 141.

It should be noted that the pixel electrode layer 16 comprises a plurality of independent pixel electrodes 161 arranged in an array and the pixel electrode has a block shape to ensure the realization of normal display function of the panel.

The metal layer 18 comprises a plurality of touch signal lines 181.

The common electrode layer 21 comprises a plurality of touch sensing areas 211, with each touch sensing area 211 disposed with a plurality of touch sensing electrode patterns 2111, and the touch sensing electrode patterns 2111 of a same row connected serially, and the touch sensing electrode patterns 2111 of a same column connected together through a corresponding touch signal line to ensure the realization of normal display function of the panel.

The pixel electrode 161 is connected to the TFT 14 via a first through hole V1 penetrating the planarization layer 15; the touch sensing electrode pattern 2111 is connected to the corresponding touch signal line 181 via a second through hole V2 penetrating the top insulating layer 19.

The in-cell touch display panel of the present invention changes the positions of the pixel electrode layer and the common electrode layer at the side of array substrate in the conventional touch display panel; wherein the pixel electrode layer 16 is changed to below the common electrode layer 21 and the common electrode layer 21 used as the touch sensor is changed to the top layer. The pixel electrode 161 is connected to the source/drain 145 of the TFT 14 via the first through hole V1 penetrating the planarization layer 15, which requiring only to drill the planarization layer 15 without the need to drill both the protective layer 17 and the planarization layer 15 as in the prior art to achieve the connection of the pixel electrode 161 to the TFT 14. Hence, only a deposition step is required to form the film without using a mask for exposure, etching, peeling processes to drill the through holes when manufacturing the protective layer 17. As such, the process eliminates a mask and a drilling process and saves production cost and improves production efficiency. In addition, placing the common electrode 21 as the touch sensor at the top layer to distance from the other signal lines to reduce the noise coupling capacitance also facilitates optimizing the sensitivity and signal-to-noise ratio (SNR), thereby improves the touch performance and product quality. The touch signal line 181 and the touch sensing electrode pattern 2111 have a smaller overlapping area so that the thickness of the top insulation layer 19 can be reduced, resulting in a thinner total thickness of the top insulating layer 19 and the protective layer 17. As such, the display performance, such as reduction in flickering, crosstalk, and so on, is improved.

Based on the same principle, the present invention also provides an electronic device, which comprises the aforementioned touch display panel. The description of the touch display panel will not be repeated here. The electronic device may be, but not limited to, LCD TV, smart phone, digital camera, tablet PC, wearable smart watch, and so on.

In summary, the present invention provides a touch display panel and an electronic device, with the positions of the pixel electrode layer and the common electrode layer at the side of array substrate in the conventional touch display panel changed; wherein the common electrode layer used as the touch sensor is changed to the top layer, and the pixel electrode layer is changed to below the common electrode layer. The pixel electrode is connected to the source/drain of the TFT via the first through hole penetrating the planarization layer, which requiring only to drill the planarization layer without the need to drill both the protective layer and the planarization layer as in the prior art to achieve the connection of the pixel electrode to the TFT. As such, the process eliminates a mask and a drilling process and saves production cost and improves production efficiency. In addition, placing the common electrode as the touch sensor at the top layer also facilitates optimizing the sensitivity and signal-to-noise ratio (SNR), thereby improves the touch performance and product quality.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An in-cell touch display panel, comprising: a thin film transistor (TFT) array substrate, the TFT arrays substrate comprising a plurality of TFTs arranged in an array, a planarization layer on top of the TFTs, a pixel electrode layer disposed on top of the planarization layer, a protective layer disposed on top of the pixel electrode layer, a metal layer disposed on top of the protective layer, a top insulating layer disposed on top of the metal layer, and a common electrode layer used as a touch sensor disposed on top of the top insulating layer;

the pixel electrode layer comprising a plurality of independent pixel electrodes arranged in an array; the metal layer comprising a plurality of touch signal lines; the common electrode layer comprising a plurality of touch sensing areas, with each touch sensing area disposed with a plurality of touch sensing electrode patterns, and the touch sensing electrode patterns of a same row connected serially, and the touch sensing electrode patterns of a same column connected together through a corresponding touch signal line;

the pixel electrode connected to the TFT via a first through hole penetrating the planarization layer; the touch sensing electrode pattern connected to the corresponding touch signal line via a second through hole penetrating the top insulating layer.

2. The in-cell touch display panel as claimed in claim 1, wherein the pixel electrode has a block shape.

3. The in-cell touch display panel as claimed in claim 1, wherein the pixel electrode layer and the common electrode layer are made of indium tin oxide (ITO).

4. The in-cell touch display panel as claimed in claim 1, wherein the in-cell touch display panel further comprises a color filter (CF) substrate disposed opposite to the TFT array substrate, and a liquid crystal (LC) layer disposed between the TFT array substrate and the CF substrate.

5. The in-cell touch display panel as claimed in claim 1, wherein the TFT substrate further comprises: a glass base, a light-shielding layer disposed on the glass base, a buffer layer disposed on the glass base and the light-shielding layer; with the TFTs disposed on top of the buffer layer;

the TFT comprising: an active layer disposed on top of the buffer layer, a gate insulating layer disposed on top of the active layer and the buffer layer, a gate disposed on top of the gate insulating layer at a location above the active layer, an interlayer insulating layer disposed on top of the gate and the gate insulating layer, and a source/drain disposed on the interlayer insulating layer contacting two sides of the active layer;

the pixel electrode connected to the source/drain of the TFT via the first through hole penetrating the planarization layer.

6. An electronic device, comprising an in-cell touch display panel, the in-cell touch display panel further comprising: a thin film transistor (TFT) array substrate, the TFT arrays substrate comprising a plurality of TFTs arranged in an array, a planarization layer on top of the TFTs, a pixel electrode layer disposed on top of the planarization layer, a protective layer disposed on top of the pixel electrode layer, a metal layer disposed on top of the protective layer, a top insulating layer disposed on top of the metal layer, and a common electrode layer used as a touch sensor disposed on top of the top insulating layer;

the pixel electrode layer comprising a plurality of independent pixel electrodes arranged in an array; the metal layer comprising a plurality of touch signal lines; the common electrode layer comprising a plurality of touch sensing areas, with each touch sensing area disposed with a plurality of touch sensing electrode patterns, and the touch sensing electrode patterns of a same row connected serially, and the touch sensing electrode patterns of a same column connected together through a corresponding touch signal line;

the pixel electrode connected to the TFT via a first through hole penetrating the planarization layer; the touch sensing electrode pattern connected to the corresponding touch signal line via a second through hole penetrating the top insulating layer.

7. The electronic device as claimed in claim 6, wherein the pixel electrode has a block shape.

8. The electronic device as claimed in claim 6, wherein the pixel electrode layer and the common electrode layer are made of indium tin oxide (ITO).

9. The electronic device as claimed in claim 6, wherein the in-cell touch display panel further comprises a color filter (CF) substrate disposed opposite to the TFT array substrate, and a liquid crystal (LC) layer disposed between the TFT array substrate and the CF substrate.

10. The electronic device as claimed in claim 6, wherein the TFT substrate further comprises: a glass base, a light-shielding layer disposed on the glass base, a buffer layer disposed on the glass base and the light-shielding layer; with the TFTs disposed on top of the buffer layer;

the TFT comprising: an active layer disposed on top of the buffer layer, a gate insulating layer disposed on top of the active layer and the buffer layer, a gate disposed on top of the gate insulating layer at a location above the active layer, an interlayer insulating layer disposed on top of the gate and the gate insulating layer, and a source/drain disposed on the interlayer insulating layer contacting two sides of the active layer;

the pixel electrode connected to the source/drain of the TFT via the first through hole penetrating the planarization layer.

11. An in-cell touch display panel, the in-cell touch display panel further comprising: a thin film transistor (TFT) array substrate, the TFT arrays substrate comprising a plurality of TFTs arranged in an array, a planarization layer on top of the TFTs, a pixel electrode layer disposed on top of the planarization layer, a protective layer disposed on top of the pixel electrode layer, a metal layer disposed on top of the protective layer, a top insulating layer disposed on top of the metal layer, and a common electrode layer used as a touch sensor disposed on top of the top insulating layer;

the pixel electrode layer comprising a plurality of independent pixel electrodes arranged in an array; the metal layer comprising a plurality of touch signal lines; the common electrode layer comprising a plurality of touch sensing areas, with each touch sensing area disposed with a plurality of touch sensing electrode patterns, and the touch sensing electrode patterns of a same row connected serially, and the touch sensing electrode patterns of a same column connected together through a corresponding touch signal line;

the pixel electrode connected to the TFT via a first through hole penetrating the planarization layer; the touch sensing electrode pattern connected to the corresponding touch signal line via a second through hole penetrating the top insulating layer;

wherein the pixel electrode having a block shape;

wherein the pixel electrode layer and the common electrode layer being made of indium tin oxide (ITO).

12. The in-cell touch display panel as claimed in claim 11, wherein the in-cell touch display panel further comprises a color filter (CF) substrate disposed opposite to the TFT array substrate, and a liquid crystal (LC) layer disposed between the TFT array substrate and the CF substrate.

13. The in-cell touch display panel as claimed in claim 11, wherein the TFT substrate further comprises: a glass base, a light-shielding layer disposed on the glass base, a buffer layer disposed on the glass base and the light-shielding layer; with the TFTs disposed on top of the buffer layer;

the TFT comprising: an active layer disposed on top of the buffer layer, a gate insulating layer disposed on top of the active layer and the buffer layer, a gate disposed on top of the gate insulating layer at a location above the active layer, an interlayer insulating layer disposed on top of the gate and the gate insulating layer, and a source/drain disposed on the interlayer insulating layer contacting two sides of the active layer;

the pixel electrode connected to the source/drain of the TFT via the first through hole penetrating the planarization layer.

* * * * *